(12) United States Patent
Colla (10) Patent No.: US 12,274,101 B2
(45) Date of Patent: Apr. 8, 2025

(54) METHOD OF DEPOSITION ON A SUBSTRATE USED FOR THE MANUFACTURE OF A SOLAR CELL, SCREEN FOR SCREEN PRINTING ON A SUBSTRATE USED FOR THE MANUFACTURE OF A SOLAR CELL, PROCESSING LINE FOR PROCESSING A SUBSTRATE USED FOR THE MANUFACTURE OF A SOLAR CELL

(71) Applicant: APPLIED MATERIALS ITALIA S.R.L., San Biagio di Callalta (IT)

(72) Inventor: Davide Colla, Treviso (IT)

(73) Assignee: APPLIED MATERIALS ITALIA S.R.L., San Biagio di Callalta (IT)

( * ) Notice: Subject to any disclaimer, the term of this patent is extended or adjusted under 35 U.S.C. 154(b) by 0 days.

(21) Appl. No.: 18/710,346

(22) PCT Filed: Nov. 17, 2021

(86) PCT No.: PCT/EP2021/081996
§ 371 (c)(1),
(2) Date: May 15, 2024

(87) PCT Pub. No.: WO2023/088552
PCT Pub. Date: May 25, 2023

(65) Prior Publication Data
US 2024/0429328 A1    Dec. 26, 2024

(51) Int. Cl.
*H10F 77/20*       (2025.01)
*H10F 19/90*       (2025.01)
*H10F 71/00*       (2025.01)

(52) U.S. Cl.
CPC ........... *H10F 77/211* (2025.01); *H10F 19/90* (2025.01); *H10F 71/00* (2025.01)

(58) Field of Classification Search
None
See application file for complete search history.

(56) References Cited

U.S. PATENT DOCUMENTS

2015/0352831 A1    12/2015    Coleman et al.

FOREIGN PATENT DOCUMENTS

| JP | 2004-006577 A | 1/2004 | |
|----|---------------|--------|---|
| JP | 2021-172046 A | 11/2021 | |
| WO | WO-2007083606 A1 * | 7/2007 | ............. B41F 15/34 |

OTHER PUBLICATIONS

International Search Report and Written Opinion for International Application No. PCT/EP2021/081996 dated Jun. 29, 2022.

* cited by examiner

*Primary Examiner* — Hsien Ming Lee
(74) *Attorney, Agent, or Firm* — Patterson + Sheridan, LLP (57) ABSTRACT

A method of deposition on a substrate used for the manufacture of a solar cell is provided. The method includes depositing a first conductive pattern on a first side of the substrate. The first conductive pattern is one of a plurality of busbars and a plurality of fingers. The method includes providing a screen over the substrate. The screen includes a set of openings. The screen has a bottom side having a varying vertical profile including low portions and high portions. The method includes transferring a printing material from the screen to the substrate through the set of openings to print a second conductive pattern on the first side of the substrate. The second conductive pattern is the other one of the plurality of busbars and the plurality of fingers. During the printing of the second conductive pattern, the first conductive pattern is substantially wet and the (Continued)

screen is disposed over the substrate in a manner such that the high portions are elevated above the first conductive pattern.

11 Claims, 9 Drawing Sheets

METHOD OF DEPOSITION ON A SUBSTRATE USED FOR THE MANUFACTURE OF A SOLAR CELL, SCREEN FOR SCREEN PRINTING ON A SUBSTRATE USED FOR THE MANUFACTURE OF A SOLAR CELL, PROCESSING LINE FOR PROCESSING A SUBSTRATE USED FOR THE MANUFACTURE OF A SOLAR CELL

FIELD

Embodiments described herein relate to the processing of substrates used for the manufacture of solar cells, such as silicon substrates. More specifically, embodiments relate to deposition processes for depositing conductive patterns, such as fingers and busbars, on substrates used for the manufacture of solar cells. The deposition processes in question can involve printing processes, such as screen printing, where deposition material is urged through a screen for printing a pattern on a substrate used for the manufacture of a solar cell.

BACKGROUND

Solar cells, or photovoltaic cells, are devices that convert sunlight into electrical power. A solar cell includes a substrate or wafer, for example a silicon wafer. Patterns of conductive material can be formed on the substrate. For example, a solar cell can include a set of fingers that are formed on the substrate. The fingers can be a plurality of parallel lines made of a conductive material, such as silver. A solar cell can include a set of busbars that are also formed on the substrate. The busbars can likewise be a plurality of parallel lines made of a conductive material such as silver. The fingers and busbars are electrically connected to each other.

The current generated by the solar cell may be collected by the fingers and may be subsequently transferred from the fingers to the busbars. The busbars may be connected to an external device so that the electrical current can be transported from the busbars to the external device.

For manufacturing a solar cell, the conductive patterns such as the fingers and busbars are deposited on the substrate in a deposition process. For example, screen printing may be used for printing the busbars and fingers on a substrate. In screen printing, a printing material, such as a silver paste, is urged through a screen having a pattern of openings corresponding to the shape of the conductive pattern that is to be printed on the substrate.

Since a number of operations and apparatuses are needed for performing the different phases of manufacturing a solar cell, the cost of ownership (including the costs of acquisition and the running costs) and the footprint of a processing line for manufacturing a solar cell can be large. Further, each individual processing station of a processing line has a finite, non-ideal yield, and the total yield of a processing line scales as the product of the individual yields. Therefore, the total yield decreases as the number of processing stations in the processing line grows larger. In light thereof, there is a need for improved methods for manufacturing solar cells.

SUMMARY

According to an embodiment, a method of deposition on a substrate used for the manufacture of a solar cell is provided. The method includes depositing a first conductive pattern on a first side of the substrate. The first conductive pattern is one of a plurality of busbars and a plurality of fingers. The method includes providing a screen over the substrate. The screen includes a set of openings. The screen has a bottom side having a varying vertical profile including low portions and high portions. The method includes transferring a printing material from the screen to the substrate through the set of openings to print a second conductive pattern on the first side of the substrate. The second conductive pattern is the other one of the plurality of busbars and the plurality of fingers. During the printing of the second conductive pattern, the first conductive pattern is substantially wet and the screen is disposed over the substrate in a manner such that the high portions are elevated above the first conductive pattern.

According to a further embodiment, a method of deposition on a substrate used for the manufacture of a solar cell is provided. The method includes depositing a first conductive pattern on a first side of the substrate. The method includes providing a screen over the substrate. The screen includes a bottom side having a varying vertical profile including low portions and high portions. The screen is provided over the substrate in a manner such that the high portions are elevated above the first conductive pattern. The method includes transferring a printing material from the screen to the substrate to print a second conductive pattern on the first side of the substrate.

According to a further embodiment, a screen for screen printing on a substrate used for the manufacture of a solar cell is provided. The screen includes a body. The body includes a set of openings for allowing printing material to pass there-through. The screen has a bottom side having a set of grooves shaped as a pattern including a plurality of lines. The set of grooves defines a varying vertical profile of the body having low portions and high portions.

According to a further embodiment, a processing line for processing a substrate used for the manufacture of a solar cell is provided. The processing line includes a first deposition station for depositing a first conductive pattern on a first side of the substrate. The processing line includes a second deposition station downstream of the first deposition station. The second deposition station includes a printer for printing a second conductive pattern on the first side of the substrate. The printer includes a screen. The screen includes an opening or set of openings. The screen has a bottom side having a varying vertical profile including low portions and high portions.

Embodiments are also directed at apparatuses for carrying out the disclosed methods and include apparatus parts for performing each described method aspect. These method aspects may be performed by way of hardware components, a computer programmed by appropriate software, by any combination of the two or in any other manner. Furthermore, embodiments according to the disclosure are also directed at methods for operating the described apparatus. The methods for operating the described apparatus include method aspects for carrying out every function of the apparatus.

BRIEF DESCRIPTION OF THE DRAWINGS

A full and enabling disclosure to one of ordinary skill in the art is set forth more particularly in the remainder of the specification including reference to the accompanying drawings wherein.

DETAILED DESCRIPTION

Reference will now be made in detail to the various embodiments, one or more examples of which are illustrated in the figures. Within the following description of the drawings, the same reference numbers refer to same components. Generally, only the differences with respect to individual embodiments are described. Each example is provided by way of explanation and is not meant as a limitation. Further, features illustrated or described as part of one embodiment can be used on or in conjunction with other embodiments to yield yet a further embodiment. It is intended that the description includes such modifications and variations.

The drawings are schematic drawings which are not drawn to scale. Some elements in the drawings may have dimensions which are exaggerated for the purpose of highlighting aspects of the present disclosure and/or for the sake of clarity of presentation.

The term "screen printing" as used herein refers to a printing process where a printing material, e.g. a conductive paste such as a silver paste, is transferred from a screen to a substrate for printing a pattern on the substrate. The screen has an opening or set of openings, i.e. through-holes, formed therein. The printing material is transferred from the screen to the substrate through the openings. The term "screen" refers to a piece of material having such an opening or set of openings for transferring the printing material therethrough. A screen as described herein can be a mesh screen or a stencil. A mesh screen may include an emulsion and a wire mesh, wherein openings are formed in the emulsion to allow the printing material to pass there-through. A stencil can be a rigid piece of material with openings formed therein.

Embodiments described herein involve the deposition of at least two conductive patterns on a substrate used for the manufacture of a solar cell. A first conductive pattern (e.g. a plurality of fingers) and a second conductive pattern (e.g. a plurality of busbars) may be deposited on the substrate. At least the second conductive pattern is printed on the substrate by screen printing. The second conductive pattern is printed on the substrate while the first conductive pattern is still wet or at least substantially wet, that is to say, before the first conductive pattern has been cured. The screen used for printing the second conductive pattern has a special design that is adapted for avoiding contact with the first conductive pattern that is still wet while the second conductive pattern is printed.

Figure 1:
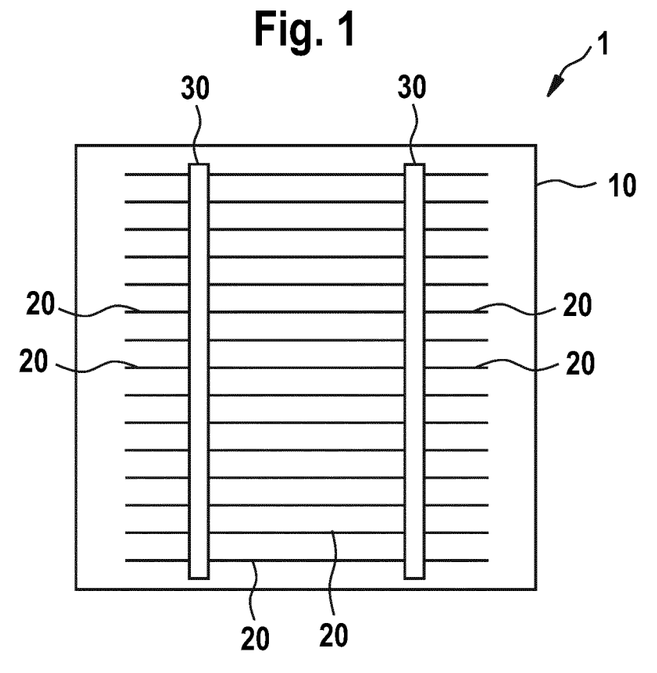
FIG. 1 shows an example of a solar cell including fingers and busbars.

FIG. 1 shows a solar cell 1 including a plurality of fingers 20 and a plurality of busbars 30 disposed on a same side (e.g. the front side) of a substrate 10.

A substrate as described herein can be a substantially flat piece of material. A substrate can be a wafer, such as a semiconductor wafer, for example a silicon wafer. A substrate may have a first side, or first surface, and a second side, or second surface, opposite the first side. The first side may be one of the front side (or front surface) and the back side (or back surface) of the solar cell. The second side may be the other one of the front side and the back side.

A finger 20 and/or a busbar 30 may be electrically conductive. A finger 20 and/or a busbar 30 may be formed from a conductive paste, for example a silver paste, that may be deposited on the substrate 10. A finger 20 and/or a busbar 30 may be printed on the substrate 10, for example by screen printing. A finger 20 of a solar cell 1 may be configured for collecting electrical current generated by the solar cell 1. Each finger 20 may be electrically connected to at least one busbar 30. Each finger 20 may contact at least one busbar 30. A busbar 30 may be configured for transporting the electrical current collected by one or more fingers 20. The number of fingers 20 and busbars 30 shown in FIG. 1 is exemplary. Different numbers of fingers 20 and/or busbars 30 can be considered.

Figure 2:
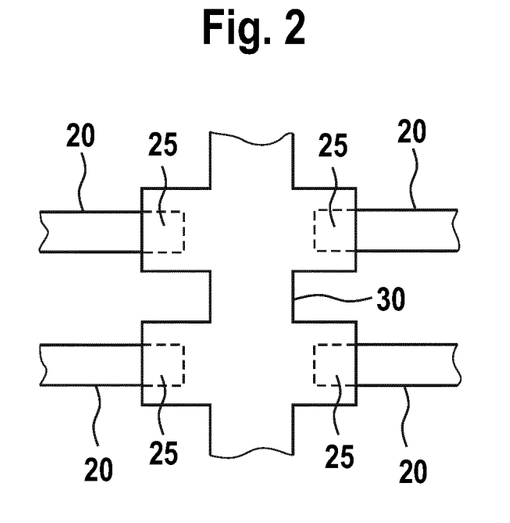
FIG. 2 shows a busbar with fingers connected thereto.

FIG. 2 shows (a portion of) a busbar 30 and multiple fingers 20 that are connected thereto. As shown, the respective fingers 20 may contact the busbar 30 to provide an electrical connection between the fingers 20 and the busbar 30. According to some embodiments, the fingers 20 may be deposited on the substrate 10 and thereafter the busbars 30 may be deposited on the substrate 10 in a manner such that a portion of each busbar 30 overlies (a) respective portion(s) 25 of one or more fingers 20, as shown in FIG. 2. In other words, a finger may partially overlap with a busbar in the sense that a portion 25 of the finger may be covered by a portion of the busbar. According to other embodiments, the busbars 30 may be deposited on the substrate 10 and thereafter the fingers 20 may be deposited on the substrate 10.

Figure 3:
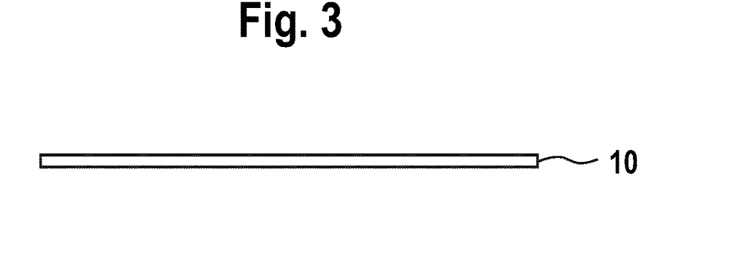
FIG. 3 shows an example of a substrate used for the manufacture of a solar cell.

FIG. 3 shows a substrate 10 in a side view. The substrate shown in FIG. 3, and likewise the substrate shown in other figures such as FIGS. 4, 8, 9, 10, 12, 13 14 and 19, may be disposed in a horizontal orientation. The substrate 10 may be disposed on a substrate support (not shown), such as a conveyor or chuck.

Figure 4:
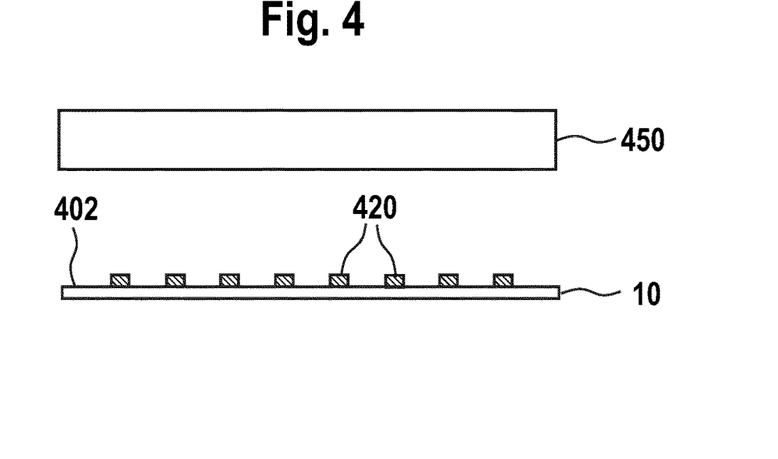
FIG. 4 illustrates deposition of a first conductive pattern on the substrate.

FIG. 4 shows a first conductive pattern 420 that is deposited on a first side 402 of the substrate 10. The first conductive pattern 420 may include a plurality of conductive lines. The first conductive pattern 420 may include, or be, one of a plurality of fingers and a plurality of busbars. The first conductive pattern 420 is not restricted to the fingers or busbars, and can be any conductive pattern deposited on the substrate 10.

The first conductive pattern 420 may be deposited on the substrate 10 by a deposition device 450. The deposition device 450 may be a printer, for example a printer including a screen for screen printing the first conductive pattern 420 on the substrate 10. Apart from a printer, other types of deposition devices may be used for depositing the first conductive pattern 420. For example, the first conductive pattern 420 may be deposited by an ink jet process, an aerosol jet process or a process involving the deposition of ink or paste through one or more nozzles (ink/paste dispensing process).

Figure 5:
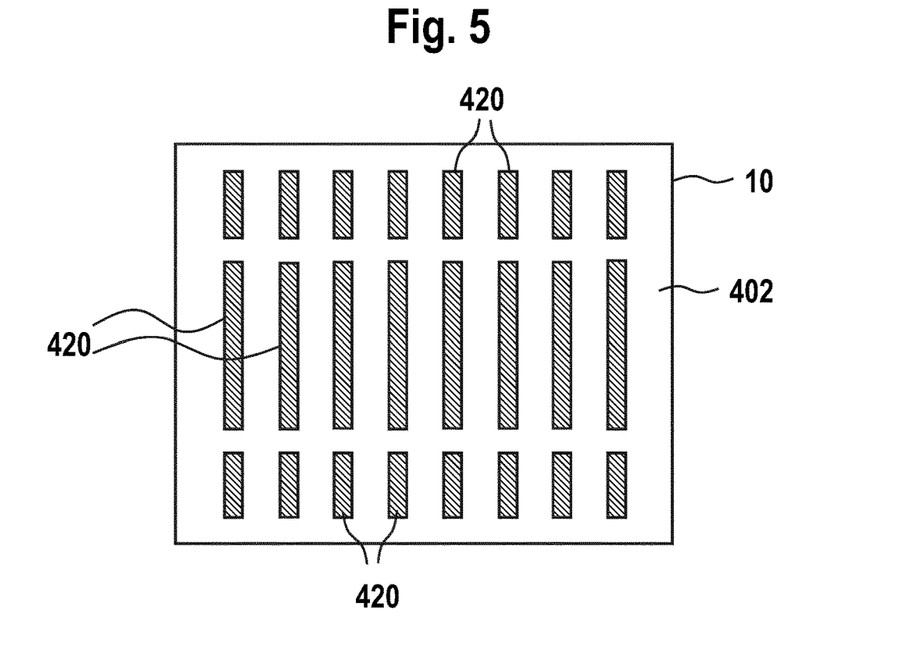
FIG. 5 shows the first conductive pattern that has been deposited on the substrate.

FIG. 5 shows a top view of the first conductive pattern 420 that has been deposited on the first side 402 of the substrate 10.

After the first conductive pattern 420 has been deposited on the first side 402 of the substrate 10, a second conductive pattern may be screen printed on the first side 402 of the substrate 10. For example, the first conductive pattern 420 may be a set of fingers like fingers 20 and the second conductive pattern may be a set of busbars like busbars 30.

Figure 6:
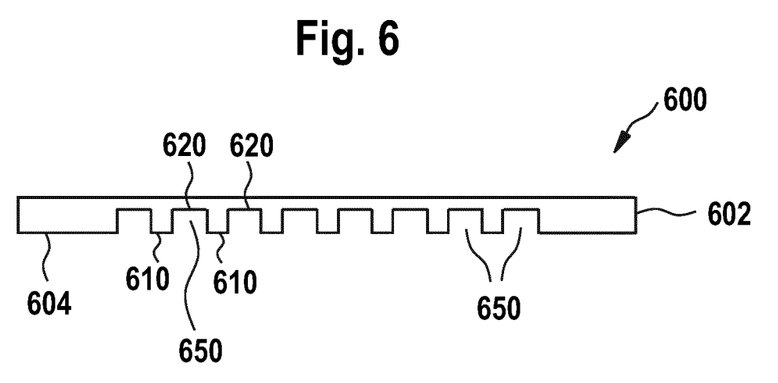
FIGS. 6-7 show a screen having a bottom side with a varying vertical profile according to embodiments described herein.
Figure 7:
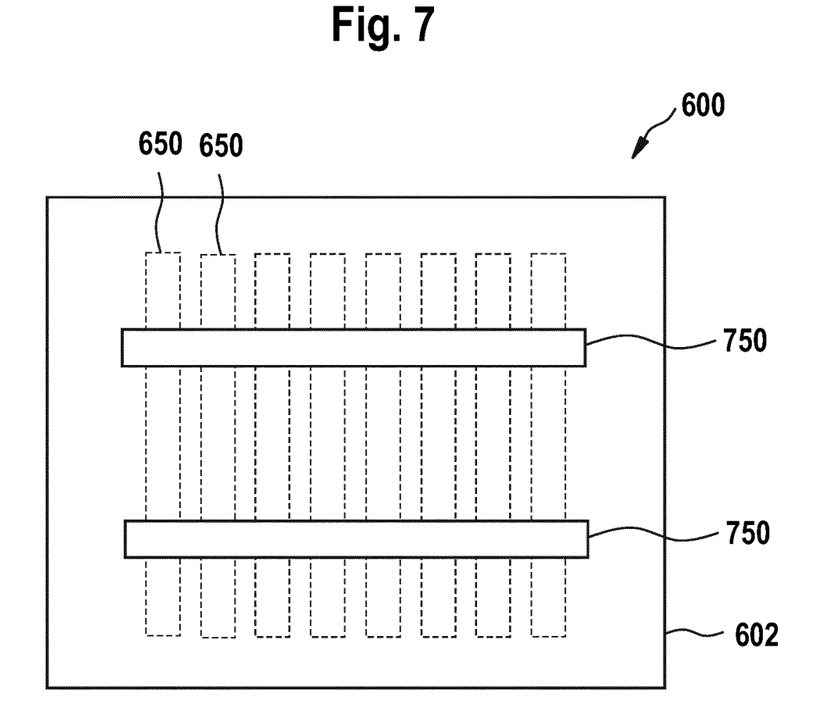

FIGS. 6-7 show a screen 600 for screen printing the second conductive pattern on the first side 402 of the substrate 10.

FIG. 6 shows the screen 600 in a horizontal orientation in a side view. FIG. 7 shows the screen 600 in a top view.

The screen 600 may have a body 602. The body may be a flexible body that may be formed from an emulsion (e.g. if the screen 600 is a mesh screen) or a rigid body, such as a metal body (e.g. if the screen 600 is a stencil).

The screen 600 may have a bottom side 604, or bottom surface. The bottom side 604 may be a side or surface of the screen configured to face the substrate 10 during printing. The bottom side 604 of the screen 600 is not a flat surface. The bottom side 604 has a varying vertical profile including low portions 610 and high portions 620. A low portion 610 can be understood as a surface at the bottom side 604 of the screen that is lower, i.e. closer to the substrate, than the high portions 620. A high portion 620 can be understood as a surface at the bottom side 604 of the screen that is higher, i.e. farther away from the substrate, than the low portions 610. A low portion of the varying vertical profile can be referred to as a low surface, a bottom portion or bottom surface, or a floor portion or floor surface, of the varying vertical profile. A low portion can be configured to face the substrate, more specifically a portion of the substrate that is spaced apart from the first conductive pattern 420. A low portion may be configured to contact the surface at a location spaced apart from the first conductive pattern. A high portion of the varying vertical profile can be referred to as a high surface, a top portion or top surface, or a ceiling portion or ceiling surface, of the varying vertical profile. A high portion can be configured to face the substrate, more specifically a portion of the first conductive pattern 420 deposited on the substrate. A high portion can be configured to avoid contact between the screen 600 and the first conductive pattern 420. A low portion 610 can be a bottom surface of a protrusion projecting from the bottom side 604. A high portion 620 can be a ceiling surface of a recess formed in the bottom side 604. The low portions 610 and high portions 620 may be offset with respect to each other in a vertical direction. For example, a vertical offset between a high portion 620 and a low portion 610 may be 50 μm less, or 30 μm or less. A varying vertical profile can be understood in the sense that a thickness of the screen 600, more specifically the thickness in a vertical direction, may be non-uniform. At a low portion 610, the screen 600 may have a thickness that is larger than a thickness of the screen 600 at a high portion 620.

The high portions 620 may be configured to avoid contact with the substrate 10 during a printing stroke that is carried out to print a second conductive pattern on the substrate 10. More specifically, the high portions 620 may be configured to avoid contact with the first conductive pattern 420 that has been deposited on the substrate 10. The vertical offset between the low portions 610 and the high portions 620 can be larger than a maximal height of the first conductive pattern 420. The low portions 610 may be configured to contact the substrate 10 during at least a portion of the printing stroke carried out to print the second conductive pattern on the substrate 10. Specifically, the low portions may be configured to contact the substrate 10 at locations that are spaced apart from the first conductive pattern 420, so that no contact is made with the first conductive pattern 420.

The bottom side 604 of the screen 600 may include a set of grooves 650, as shown in FIGS. 6 and 7. A groove 650 may be shaped as a line. A groove 650 may have a ceiling, a first sidewall and a second sidewall. Each high portion 620 may be a ceiling of a groove 650. Between any two grooves 650, a low portion 610 may be provided. A low portion 610 may be part of a ridge formed between two grooves 650. The set of grooves 650 may form a pattern that is tailored to the shape of the first conductive pattern 420 deposited on the substrate 10. Each groove 650 may be configured to cover a portion of the first conductive pattern 420, without contacting the first conductive pattern 420, when the screen 600 is placed over the substrate 10 for printing the second conductive pattern on the substrate 10.

FIG. 7 shows the screen 600 in a top view. The grooves 650 are formed in the bottom side 604 of the screen and are not visible in a top view of the screen. For better understanding, the position of the grooves 650 is indicated in FIG. 7 with dashed lines.

The screen 600 may include a set of openings 750 (or a single opening) in the body 602. The openings 750 may be through-holes. The set of openings 750 may be configured for transferring a printing material from the screen 600 to the substrate 10 through the set of openings 750. The set of openings 750 may be configured for printing the second conductive pattern on the substrate 10. The set of openings 750 may form a pattern having a shape corresponding to a shape of the second conductive pattern that is to be printed on the substrate 10. For example, where the second conductive pattern is a set of busbars that is to be printed on the substrate, the set of openings 750 may have a shape corresponding to the shape of the busbars. The set of openings 750 is shown in FIG. 7. The openings 750 are not shown in FIG. 6 in order not to overload the figure.

According to embodiments described herein, the second conductive pattern is printed on the substrate 10 while the first conductive pattern 420 is still substantially wet, that is to say, while the first conductive pattern 420 is still in a substantially liquid form. The term "substantially wet" may refer to the state of the first conductive pattern 420 before the first conductive pattern 420 is cured to bring the first conductive pattern 420 into a final, solid and hardened state. A substantially wet pattern is fragile and easily deformed, since the final curing has not been carried out. The term "substantially wet" allows for a small amount of pre-curing, or skin drying, that may be performed to dry a thin upper surface of the first conductive pattern 420 in order to provide for at least a small degree of robustness. Such robustness may be beneficial for handling the substrate 10 after the first conductive pattern 420 has been deposited thereon and for printing at least a portion of the second conductive pattern on top of the first conductive pattern 420. In other words, that the first conductive pattern 420 is substantially wet, or in a substantially liquid form, encompasses an uncured first conductive pattern 420 as well as a first conductive pattern 420 that has been subjected to pre-curing.

During printing of the second conductive pattern, contact between the screen 600 and the first conductive pattern 420 shall be avoided in order not to deform the first conductive pattern 420.

Figure 8:
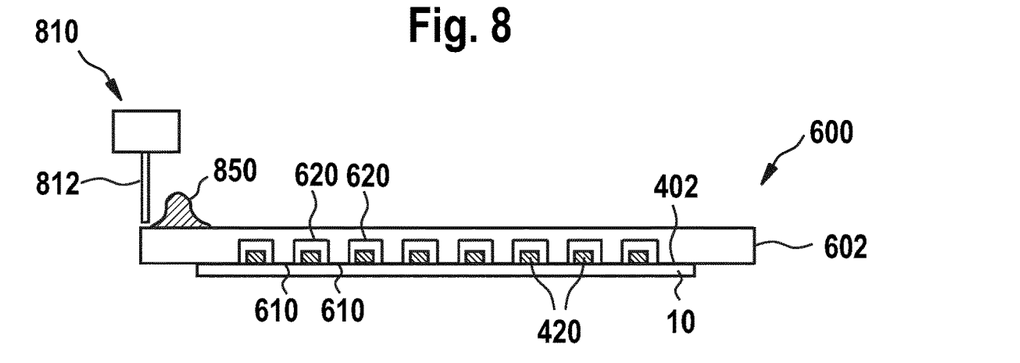
FIG. 8 illustrates printing of a second conductive pattern on the substrate using a screen according to embodiments described herein.

FIG. 8 illustrates the printing of the second conductive pattern on the first side 402 of the substrate 10.

A print head 810 for printing the second conductive pattern may be provided. The print head 810 may be movable in a horizontal direction to perform a printing stroke. In the example shown in FIG. 8, the print head 810 may move to the right side of the screen 600 for performing a printing stroke. The print head 810 may include a squeegee 812. The squeegee 812 may be configured for applying a pressure to the screen 600 for transferring a printing material 850 from the screen 600 to the substrate 10 to print the second conductive pattern.

The screen 600 may be provided over the substrate 10. Providing the screen 600 over the substrate 10 may be performed by moving the screen 600 into a position over the substrate 10, by moving the substrate 10 into a position below the screen 600, or a combination of both.

When the screen 600 is over the substrate 10 for printing the second conductive pattern, the high portions 620 are elevated above the first conductive pattern 420. The high portions 620 may be spaced apart from the first conductive pattern 420 in a vertical direction. The high portions 620 do not contact the first conductive pattern 420.

The first conductive pattern 420 may have a first shape. The high portions 620 may form a pattern having a second shape encompassing, or enclosing, the first shape. For example, comparing the shape of the grooves 650 in FIG. 7 with the shape of the first conductive pattern 420 in FIG. 5, the shape of the set of grooves 650 ensures that each conductive line of the first conductive pattern 420 will be inside the perimeter of a groove 650 when the screen 600 is provided over the substrate 10, so that any contact between the screen 600 and the first conductive pattern 420 can be avoided.

The low portions 610 may be spaced apart from the first conductive pattern 420 in a horizontal direction. At least some of the low portions 610 may contact the substrate 10 during at least a portion of the printing stroke carried out for printing the second conductive pattern on the substrate. The low portions 610 in question may contact the substrate 10 at locations that are spaced apart from the first conductive pattern 420. The low portions 610 may not contact the first conductive pattern 420 during printing of the second conductive pattern on the substrate. No part of the screen 600 may contact the first conductive pattern 420 during printing of the second conductive pattern on the substrate.

A high portion 620 as described herein may be a ceiling of a groove formed in the bottom side of the screen 600. The groove can have a first sidewall and a second sidewall joining the ceiling on opposite sides of the ceiling. The first sidewall may join the high portion 620, i.e. the ceiling, at a first edge portion. The second sidewall may join the high portion 620, i.e. the ceiling, at a second edge portion. The first edge portion and the second edge portion may be rounded, or curved, portions. In light thereof, the groove may be better adapted for avoiding contact with the first conductive pattern. In other embodiments, the first sidewall and/or the second sidewall may be a tapered sidewall. A tapered sidewall may be beneficial for avoiding contact with the first conductive pattern. A low portion 610 as described herein may be adjacent to a groove. The low portion 610 may join a sidewall of the groove at an edge portion. The edge portion may be a rounded, or curved, edge portion. In light thereof, the bottom portion may be better adapted for avoiding contact with the first conductive pattern.

FIG. 8 illustrates a printing stroke where the squeegee 812 moves in a direction perpendicular to the direction of the grooves 650 in the screen ("perpendicular printing"). In other embodiments, the printing stroke may be performed by moving the squeegee in a direction parallel to the direction of the grooves ("parallel printing"). Such parallel printing has the advantage that the squeegee will extend in a direction perpendicular to the direction of the grooves, so that the pressure exerted by the squeegee on the screen is distributed over multiple grooves. The pressure on each individual low portion 610 and each individual high portion 620 is lower than in the case of perpendicular printing, so that the risk that a high portion is pushed downward to touch the first conductive pattern is reduced.

Figure 9:
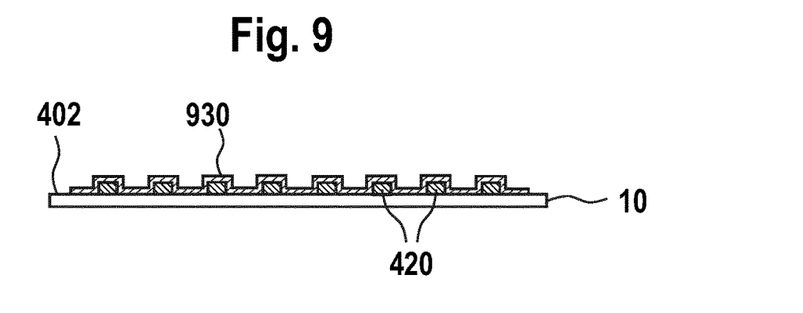
FIGS. 9-10 show the substrate after the first conductive pattern and the second conductive pattern have been deposited thereon.
Figure 10:
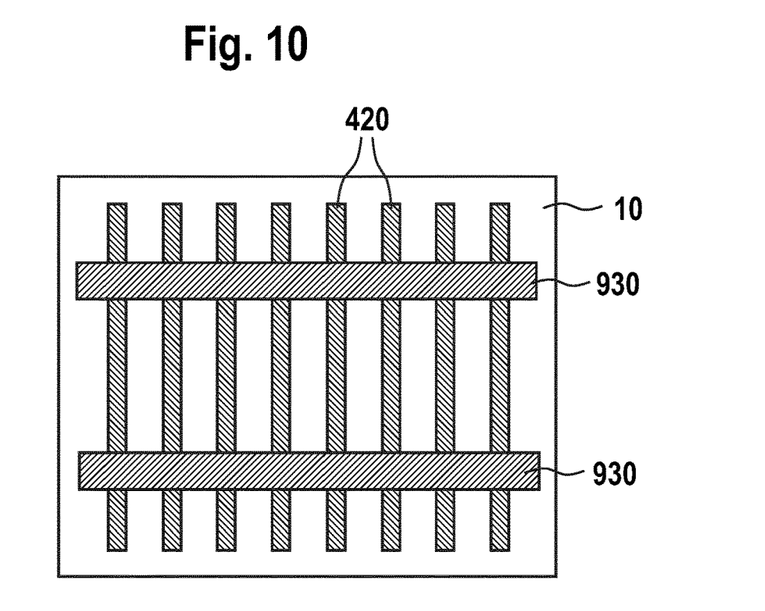

FIGS. 9-10 show the substrate 10 after the second conductive pattern 930 has been printed thereon. FIG. 9 shows a side view, FIG. 10 shows a top view. As shown, the second conductive pattern 930 may include a set of busbars, like the busbars 30 discussed above.

The process illustrated in FIGS. 3-10 is an exemplary implementation of embodiments described herein and can be modified in several ways.

For example, the figures show that first the fingers are deposited as the first conductive pattern and that thereafter the busbars are deposited as the second conductive pattern. The disclosure is not limited hereto. According to some embodiments, the first conductive pattern can be the busbars and the second conductive pattern can be the fingers. In other words, the busbars can be deposited first, and thereafter the fingers can be printed. The shape of the set of openings in the screen can accordingly have a form configured for printing the fingers, and the low portions and high portions can have a shape configured for avoiding contact with the busbars.

Further, the first conductive pattern and the second conductive pattern can be any conductive patterns other than fingers or busbars. Embodiments described herein, wherein a screen having a varying vertical profile at the bottom side thereof is used to avoid contact with a wet pattern deposited on the substrate, can be used for any patterns that may be deposited on a substrate used for the manufacture of a solar cell.

Further, as shown in the figures, the first conductive pattern and the second conductive pattern may partially overlap with each other. The disclosure is not limited thereto. According to some embodiments, non-overlapping conductive patterns may be provided.

Further, as shown in the figures, the bottom side of the screen may include grooves, such that the high portions are ceilings of the grooves. The disclosure is not limited thereto. As described in more detail further below, a varying vertical profile may be provided in other ways, without the provision of grooves.

In light of the above, according to an embodiment, a method of deposition on a substrate used for the manufacture of a solar cell is provided. The method includes depositing a first conductive pattern on a first side of the substrate.

The method includes providing a screen over the substrate. The screen includes a bottom side having a varying vertical profile including low portions and high portions. The screen is provided over the substrate in a manner such that the high portions are elevated above the first conductive pattern. The method includes transferring a printing material from the screen to the substrate to print a second conductive pattern on the first side of the substrate.

Embodiments described herein allow for a wet on wet deposition of multiple patterns on a same side of a substrate used for the manufacture of a solar cell. Embodiments described herein provide the advantage that contact between the screen and the first conductive pattern that is still wet is avoided when printing the second conductive pattern, so that a deformation of the first conductive pattern can be prevented. As a further advantage, the first conductive pattern and the second conductive pattern can be cured jointly in a single curing station. An advantage is provided over processing lines that provide a first curing of the first conductive pattern before depositing the second conductive pattern and a second curing of the second conductive pattern, since such processing lines involve two separate curing stations. Embodiments described herein can operate with a single curing operation after both patterns have been deposited. The number of processing stations of the processing line can be reduced.

A method according to embodiments described herein may be a method of wet on wet deposition on a substrate used for the manufacture of a solar cell.

The screen may include an opening or set of openings. The printing material may be transferred through the opening or set of openings to print the second conductive pattern on the first side of the substrate.

A method according to embodiments described herein may be such that, during the printing of the second conductive pattern, the screen does not contact the first conductive pattern.

During the printing of the second conductive pattern, the first conductive pattern may be substantially wet. During the printing of the second conductive pattern, the screen may be provided over the substrate in a manner such that the high portions are elevated above the first conductive pattern.

The first conductive pattern may be one of a plurality of busbars and a plurality of fingers. The second conductive pattern may be the other one of the plurality of busbars and the plurality of fingers.

A method according to embodiments described herein may include bringing at least some of the low portions of the bottom side of the screen into contact with the substrate at locations spaced apart from the first conductive pattern.

The first conductive pattern may have a first shape. The high portions of the bottom side of the screen may form a pattern having a second shape encompassing the first shape.

The high portions of the bottom side of the screen may be ceilings of a set of grooves formed in the screen. The set of grooves may be shaped as a pattern including a plurality of lines.

Figure 11:
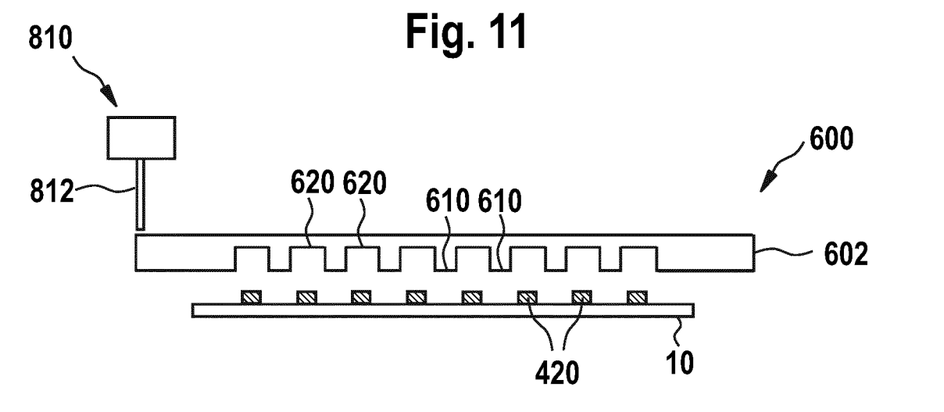
FIGS. 11-12 illustrate printing of the second conductive pattern using a screen according to embodiments described herein.
Figure 12:
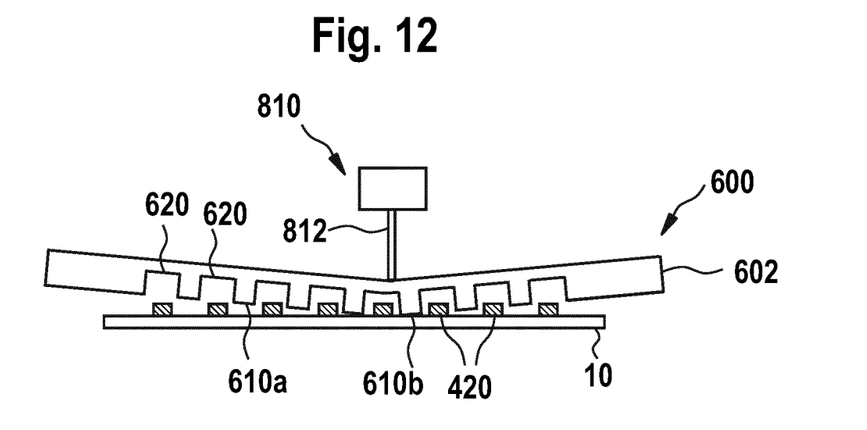

Reference is again made to FIG. 8, illustrating the printing of the second conductive pattern on the substrate 10 (perpendicular printing). In the schematic representation shown in FIG. 8, it may appear that substantially all low portions 610 are maintained in contact with the substrate 10 during printing of the second conductive pattern. Such a situation may arise in some embodiments, for example in cases where the screen 600 is a stencil formed from a rigid material that rests on the substrate. The disclosure is not limited thereto. In some embodiments, at any given time during a printing stroke for the printing of the second conductive pattern, only a subset of the low portions 610 may be in contact with the substrate 10, and the subset of low portions 610 that is in contact with the substrate may change along the course of said printing stroke. For example, the screen 600 may be made of a flexible material (e.g. a mesh screen) so that the screen is subject to a certain degree of bending during printing. For example, as shown in FIGS. 11-12, bending of the screen 600 can be caused by a squeegee 812 that exerts a downward pressure on the screen 600, resulting in an inclination of the screen 600 at the position of the squeegee 812. FIG. 11 shows the screen 600 at a vertical distance above the substrate 10, before the printing stroke has started. All low portions 610 as well as all high portions 620 are elevated above the screen, in other words neither the low portions 610 nor the high portions 620 touch the screen 600. FIG. 12 shows a state of operation during the printing stroke (for ease of presentation, the second conductive pattern is not shown in FIG. 12). The squeegee 812 presses down on the screen 600, resulting in a downward movement of a portion of the screen 600, resulting in an inclination of the screen 600. The low portions 610 in the vicinity of the position of the squeegee 812, such as low portion 610*b*, may contact the substrate 10, and other low portions farther away from the squeegee 812, such as low portion 610*a*, may continue to be elevated above the substrate 10, i.e. will not contact the substrate 10. As the squeegee 812 moves further to the right for performing the printing stroke, the low portion 610*b* will again move upward and will cease to contact the substrate 10. In light thereof, a low portion 610 may contact the substrate 10 during at least a portion of a printing stroke performed for printing the second conductive pattern.

A method according to embodiments described herein may include jointly curing the first conductive pattern and the second conductive pattern.

The curing of a conductive pattern can be understood as a process configured for rendering a wet, or liquid, conductive pattern into a solid, hardened state. A curing process may include a heating process or a drying process. A distinction is made between fully curing and pre-curing, as described herein.

Figure 13:
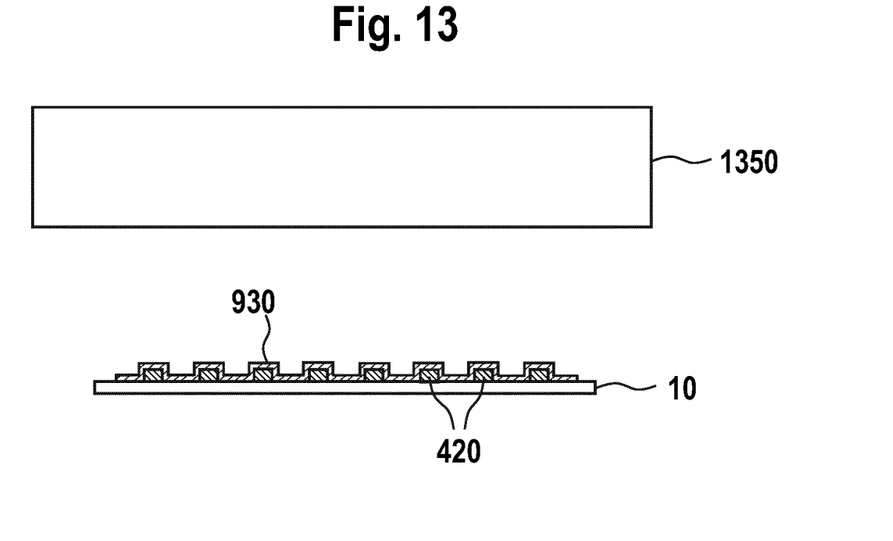
FIG. 13 illustrates jointly curing the first conductive pattern and the second conductive pattern.

FIG. 13 illustrates a joint curing of the first conductive pattern 420 and the second conductive pattern 930. The first conductive pattern 420 and the second conductive pattern 930 may be cured together, i.e. simultaneously. A heater 1350 may be provided for jointly curing the first conductive pattern 420 and the second conductive pattern 930. The heater 1350 may include, for example, one or more heating lamps, or one or more resistors. The heater 1350 may be part of a curing station as described herein, such as a curing oven. After the curing performed by the heater 1350, the first conductive pattern 420 and the second conductive pattern 930 may be fully cured. That is to say, the first conductive pattern 420 and the second conductive pattern 930 may be in their final, dried and hardened state. After the curing performed by the heater 1350, no further curing of the first conductive pattern 420 or the second conductive pattern 930 may be needed.

A method according to embodiments described herein may include pre-curing the first conductive pattern prior to printing the second conductive pattern. Pre-curing (or skin curing or skin drying), can be understood as an initial, short curing operation which is performed to cure only the upper surface of the first conductive pattern, or a portion of the upper surface (e.g. a tip of a finger), without curing the first conductive pattern entirely. Pre-curing is distinguished from a full curing, the latter being performed later in a joint curing operation for fully curing the first conductive pattern and the second conductive pattern together, as described herein.

Figure 14:
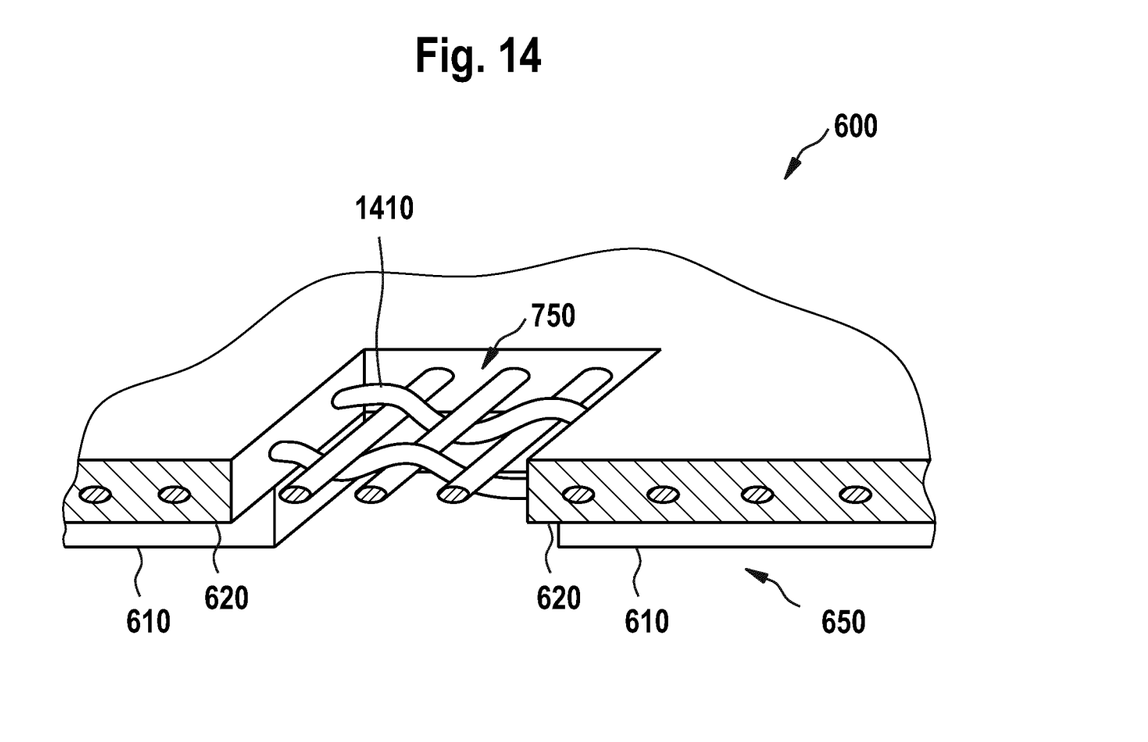
FIG. 14 shows a screen for printing the second conductive pattern according to embodiments described herein.

FIG. 14 shows an example of a screen 600 in a cross-sectional view. The screen 600 includes an opening 750 for printing a busbar. A wire mesh 1410 is exposed in the opening 750. The screen 600 includes a groove 650 at a bottom side of the screen 600. The groove extends along a left-right direction. The bottom side of the screen includes low portions 610 and high portions 620 as described herein. The ceiling of the groove 650 forms high portions 620.

Figure 15:
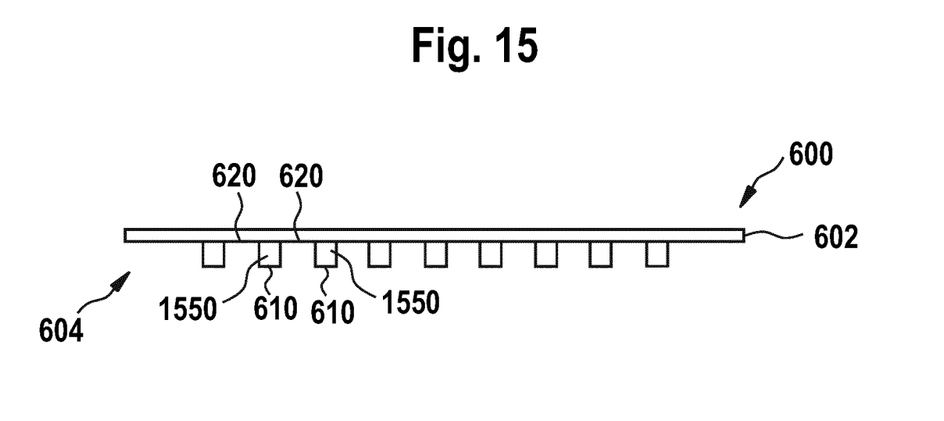
FIGS. 15-16 show a screen for printing the second conductive pattern according to embodiments described herein.
Figure 16:
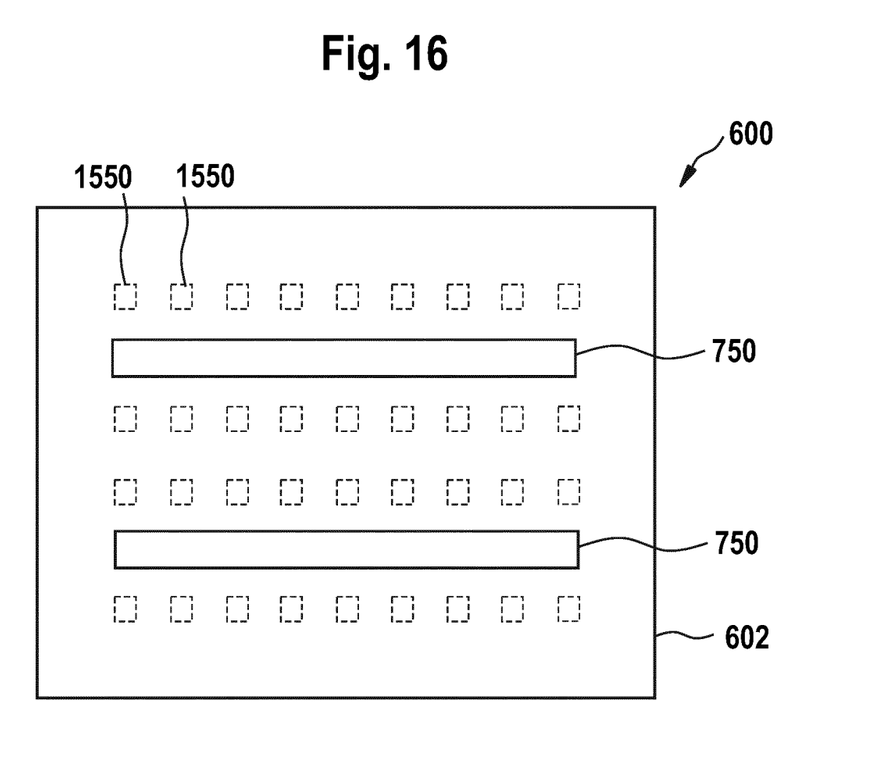

As described herein, the bottom side 604 of the screen 600 may include grooves 650, such that the high portions 620 are ceilings of the grooves 650. The disclosure is not limited thereto. A varying vertical profile of the bottom side of the screen 600 may be provided in other ways, without the provision of grooves. For example, FIGS. 15-16 show a screen 600 wherein the grooves 650 are not present. The screen 600 may include a plurality of spacers 1550 attached to, or forming part of, the body 602 of the screen 600. The spacers 1550 may be elongated protrusions that project downwardly from the body 602. The low portions 610 may be formed by the bottom surfaces of the spacers 1550. The high portions 620 may be portions of the body 602 in between the spacers 1550. The spacers 1550 may be arranged in a manner which is configured to avoid contact with the first conductive pattern 420. When placing the screen 600 over the substrate 10 on which the first conductive pattern 420 has been deposited, the spacers 1550 may contact the substrate 10 at locations that are spaced apart from the first conductive pattern 420, so that the screen 600 does not contact the first conductive pattern 420 when the second conductive pattern 930 is printed.

The deposition of the first conductive pattern 420 on the substrate 10 may include printing, particularly screen printing, the first conductive pattern 420 on the substrate 10.

Figure 17:
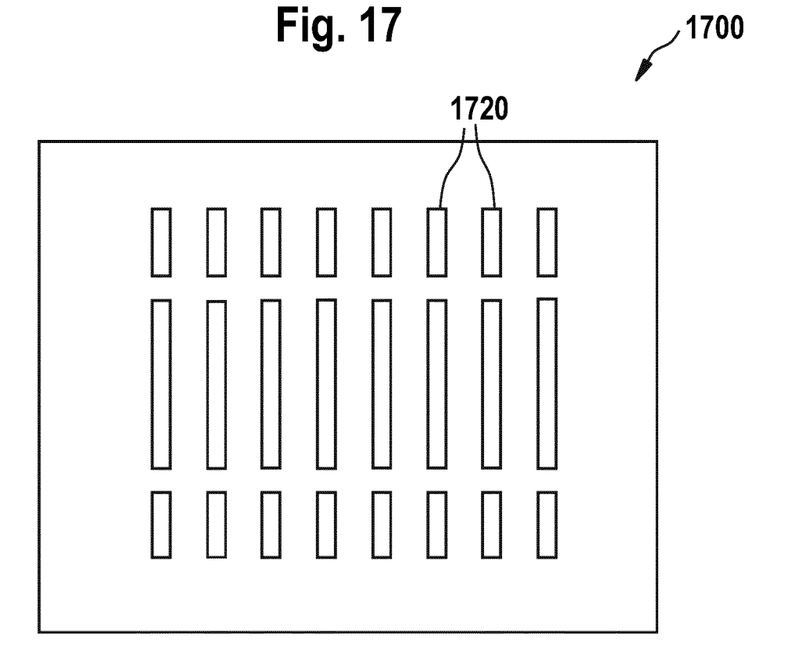
FIG. 17 shows a screen for printing the first conductive pattern according to embodiments described herein.

FIG. 17 shows a screen 1700 for printing the first conductive pattern 420. The screen 1700 may include a set of openings 1720. The set of openings 1720 may be configured for letting a printing material, e.g. a conductive paste such as a silver paste, pass therethrough for printing the first conductive pattern 420.

The screen 1700 for printing the first conductive pattern 420 may be understood as the first screen as described herein. The screen 600 for printing the second conductive pattern 930 may be understood as the second screen as described herein.

Figure 18:
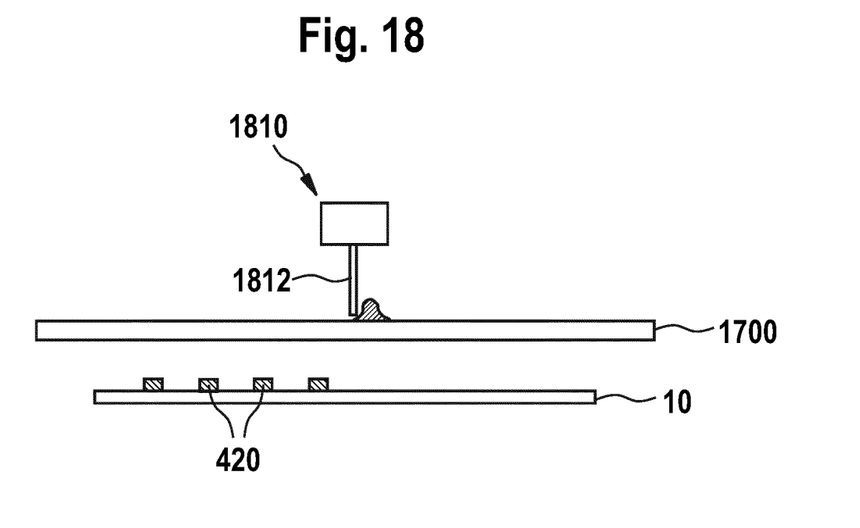
FIG. 18 illustrates printing of the first conductive pattern.

FIG. 18 illustrates a printing stroke for printing the first conductive pattern 420 on the substrate 10 using the screen 1700. A print head 1810 including a squeegee 1812 moves over the screen 1700 for printing the first conductive pattern 420 on the substrate 10.

The screen used for printing the second conductive pattern on the first side of the substrate may be a second screen. The openings or set of openings of the second screen may be a second opening or set of openings. The printing material may be a second printing material. Depositing the first conductive pattern may include providing a first screen over the substrate. The first screen may include a first opening or set of openings. Depositing the first conductive pattern may include transferring a first printing material from the first screen to the substrate through the first opening or set of openings to print the first conductive pattern on the substrate.

According to a further embodiment, a method of deposition on a substrate used for the manufacture of a solar cell is provided. The method includes depositing a first conductive pattern on a first side of the substrate. The first conductive pattern is one of a plurality of busbars and a plurality of fingers. The method includes providing a screen over the substrate. The screen includes a set of openings. The screen has a bottom side having a varying vertical profile including low portions and high portions. The method includes transferring a printing material from the screen to the substrate through the set of openings to print a second conductive pattern on the first side of the substrate. The second conductive pattern is the other one of the plurality of busbars and the plurality of fingers. During the printing of the second conductive pattern, the first conductive pattern is substantially wet and the screen is disposed over the substrate in a manner such that the high portions are elevated above the first conductive pattern. The method may include any of the features and aspects, and any combinations thereof, of embodiments of the method described above.

According to a further embodiment, a screen for screen printing on a substrate used for the manufacture of a solar cell is provided. The screen includes a body. The body includes a set of openings for allowing printing material to pass there-through. The screen has a bottom side having a set of grooves shaped as a pattern including a plurality of lines. The set of grooves defines a varying vertical profile of the body having low portions and high portions. The screen may be used for performing any of the embodiments of the methods described above.

Figure 19:
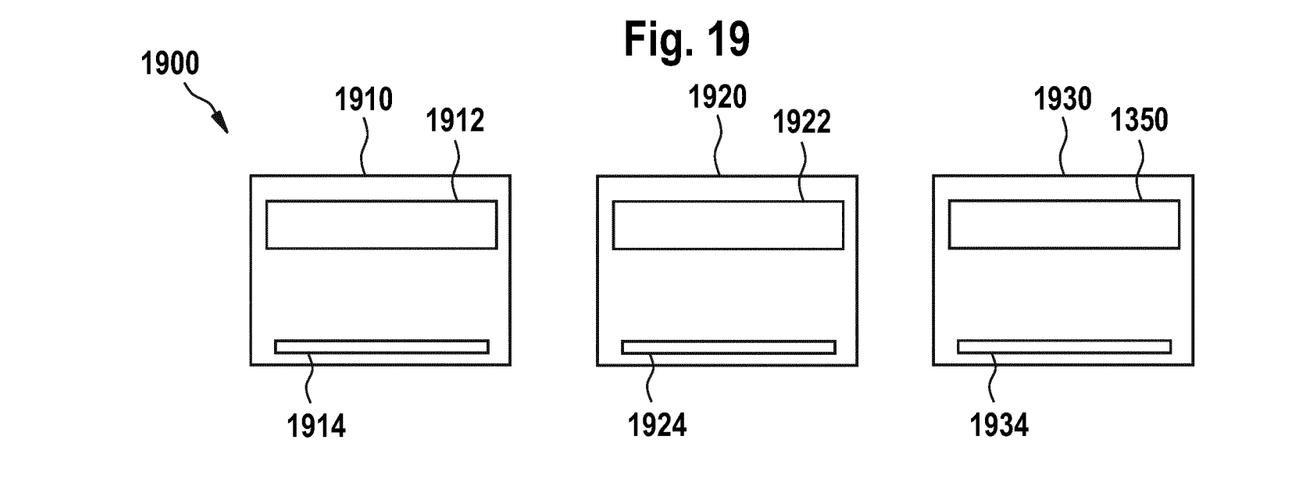
FIGS. 19-20 show a processing line for processing a substrate used for the manufacture of a solar cell according to embodiments described herein.

FIG. 19 shows a processing line 1900 according to embodiments described herein.

The processing line 1900 may include a first deposition station 1910 for depositing the first conductive pattern on the first side of the substrate. The first deposition station 1910 may include a deposition device 1912, such as a printer or other deposition device, for depositing the first conductive pattern on the first side of the substrate. The deposition device 1912 may include at least one of a screen and a deposition head, such as screen 1700 and/or print head 1810 including squeegee 1812 as shown in FIGS. 17-18, for screen printing the first conductive pattern on the substrate. The first deposition station 1910 may include a first substrate support 1914 for supporting the substrate during deposition of the first conductive pattern.

The processing line 1900 may include a second deposition station 1920 downstream of the first deposition station 1910. The second deposition station 1920 includes a printer 1922 for printing the second conductive pattern on the first side of the substrate. The printer 1922 includes a screen 600 including a bottom side having a varying vertical profile including low portions and high portions, as described herein. The second deposition station 1920 may include a second substrate support 1924 for supporting the substrate during printing of the second conductive pattern.

The processing line 1900 may include a curing station 1930 downstream of the second deposition station 1920 for jointly curing the first conductive pattern and the second conductive pattern. The curing station 1930 may include a heater 1350 as described herein. The heater 1350 may be configured for fully curing the first conductive pattern and the second conductive pattern. The curing station 1930 may include a third substrate support 1934 for supporting the substrate during curing of the first conductive pattern and the second conductive pattern.

Embodiments described herein provide the advantage that, due to the wet on wet printing that is made possible by the special design of the screen 600, only one curing station may be used for curing (that is to say, fully curing, as opposed to pre-curing) multiple conductive patterns. In light of the fact that a curing oven can have a length of several meters, a footprint and a consumption of electrical power of the processing line can be considerably reduced. In particular, for depositing the busbars and fingers on both sides of the substrate (i.e. the front side and back side) conventional processing lines use two curing ovens for curing the patterns deposited on the front side of the cell (namely, one curing oven for curing the fingers and another curing oven for curing the busbars) and two further curing ovens for curing the two patterns deposited on the back side of the cell, in words four curing ovens are used in total. In contrast, by jointly curing the patterns on the front side of the cell in a single oven and jointly curing the patterns on the back side in another single oven according to embodiments described herein, only two ovens are used in total, resulting in a significantly reduced length and footprint of the processing line. Further, even when a pre-curing station is used for pre-curing the first conductive pattern, as described herein, then the footprint is only marginally affected, since for pre-curing a small i.e. short curing station is sufficient since the pre-curing only intends to cure a thin upper layer of the conductive pattern. In light thereof, even when using a pre-curing station, the resulting processing line has a reduced length and footprint as compared to conventional processing lines.

The first substrate support 1914, the second substrate support 1924 and the third substrate support 1934 may be separate supports, each support being assigned to a respective station, as shown in FIG. 19. The disclosure is not limited thereto. In some embodiments, some of the three supports, or all of the three supports, may be support portions forming part of a common support system. For example, the first substrate support 1914 and the second substrate support 1924 may be portions of a belt conveyor serving both the first deposition station 1910 and the second deposition station 1920. In other embodiments, the first substrate support 1914 and the second substrate support 1924 may be a same substrate support that is movable from the first deposition station 1910 to the second deposition station 1920. The substrate support in question may first be positioned in the first deposition station 1910 for deposition of the first conductive pattern, and may thereafter be moved to the second deposition station 1920 for printing of the second conductive pattern.

During operation of the processing line 1900, the substrate may be disposed on the first substrate support 1914 of the first deposition station 1910. The deposition device 1912 may deposit the first conductive pattern on the substrate supported by the first substrate support 1914. While the first conductive pattern is substantially wet, the substrate including the first conductive pattern may be transferred to the second deposition station 1920. Thereafter, the second conductive pattern may be printed on the substrate by the printer 1922, while the first conductive pattern is substantially wet. The substrate including the first conductive pattern and the second conductive pattern may be transferred to the curing station 1930. In the curing station 1930, the first conductive pattern and the second conductive pattern may be jointly cured by the heater 1350.

Figure 20:
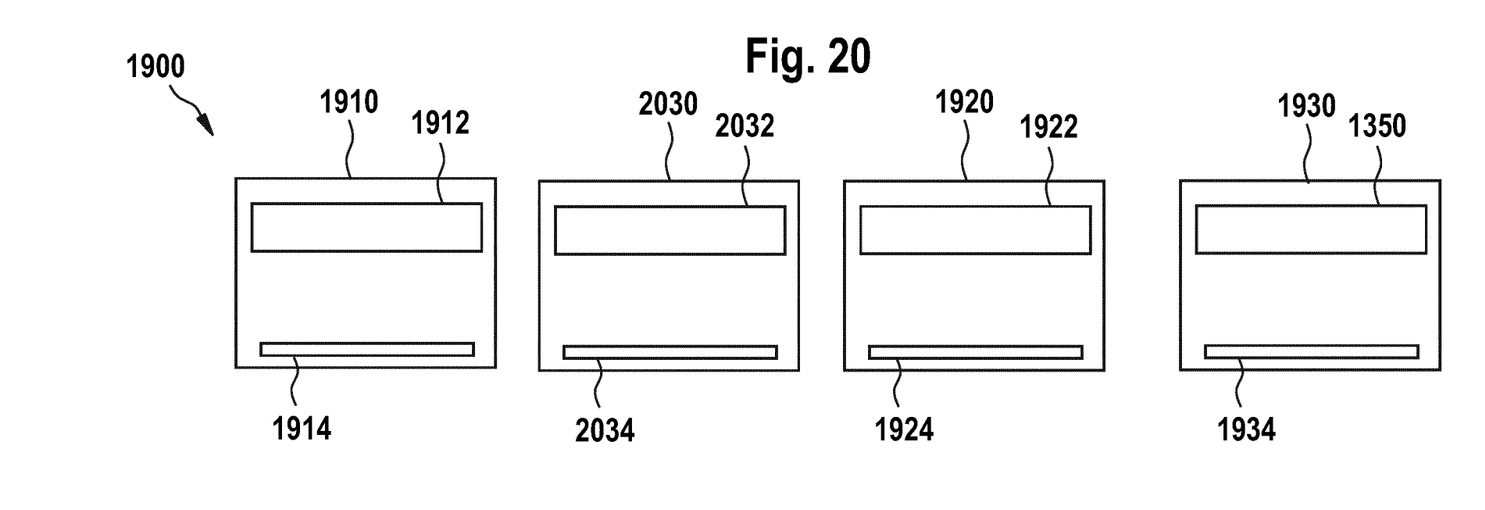

FIG. 20 shows a processing line 1900 according to embodiments described herein. As shown, a processing line 1900 may include a pre-curing station 2030 for pre-curing the first conductive pattern before the second conductive pattern is printed on the substrate. The pre-curing station may be downstream of the first deposition station 1910 and upstream of the second deposition station 1920. The pre-curing station 2030 may include a heater 2032 for pre-curing the first conductive pattern. The pre-curing station 2030 may include a fourth substrate support 2034 for supporting the substrate during the pre-curing.

According to a further embodiment, a processing line for processing a substrate used for the manufacture of a solar cell is provided. The processing line includes a first deposition station for depositing a first conductive pattern on a first side of the substrate. The processing line includes a second deposition station downstream of the first deposition station. The second deposition station includes a printer for printing a second conductive pattern on the first side of the substrate. The printer includes a screen. The screen includes an opening or set of openings. The screen has a bottom side having a varying vertical profile including low portions and high portions. The processing line may be configured for performing any of the embodiments of the methods described above.

The first deposition station may include a first substrate support for supporting the substrate during deposition of the first conductive pattern.

The second deposition station may include a second substrate support for supporting the substrate during printing of the second conductive pattern. The first support and the second support may be separate supports or may be different portions of a common support, e.g. different portions of a conveyor belt that runs through both the first deposition station and the second deposition station.

The screen may be arranged above the second support. Alternatively, at least one of the second substrate support and the screen may movable to provide a configuration where the screen is above the second substrate support. The screen and the second substrate support may be configured to be provided into a configuration such that the high portions of the bottom side of the screen are elevated above the first conductive pattern.

The printer of the second deposition station may be configured for transferring a printing material from the screen to the substrate supported by the second substrate support to print the second conductive pattern on the first side of the substrate. The printer may include a squeegee for urging the printing material through the screen. The squeegee may be movable over the screen to perform a printing stroke.

The screen and the second substrate support may be configured to be provided into a configuration such that the screen does not contact the first conductive pattern during printing of the second conductive pattern when the substrate is supported by the second substrate support.

The screen and the second substrate support may be configured to be provided into a configuration such that at least some of the low portions of the bottom side of the screen are in contact with the substrate at locations spaced apart from the first conductive pattern when the substrate is supported by the second substrate support.

The printer may be a second printer. The screen may be a second screen. The first deposition station may include a first printer including a first screen. The first printer may be configured for printing the first conductive pattern on the substrate. The first printer may include a first squeegee for urging printing material through the first screen to print the first conductive pattern.

The processing line may include a curing station downstream of the second deposition station for jointly curing the first conductive pattern and the second conductive pattern. The curing station may include a first heater for jointly curing the first conductive pattern and the second conductive pattern. The joint curing may be a full curing of the first conductive pattern and the second conductive pattern.

The processing line may include a pre-curing station downstream of the first deposition station and upstream of the second deposition station for pre-curing the first conductive pattern. The pre-curing station may include a second heater for pre-curing the first conductive pattern.

The processing line may be a processing line for wet on wet deposition on a substrate used for the manufacture of a solar cell.

While the foregoing is directed to embodiments of the disclosure, other and further embodiments of the disclosure may be devised without departing from the basic scope thereof, and the scope thereof is determined by the claims that follow.

The invention claimed is:

1. A method of deposition on a substrate used for the manufacture of a solar cell, comprising:
depositing a first conductive pattern on a first side of the substrate, the first conductive pattern being one of a plurality of busbars and a plurality of fingers;
providing a screen over the substrate, the screen comprising:
a set of openings; and
a bottom side having a varying vertical profile including a plurality of bottom portions and a plurality of top high portions, such that the plurality of bottom portions are positioned lower than the plurality of top portions;
transferring a printing material from the screen to the substrate through the set of openings to print a second conductive pattern on the first side of the substrate, the second conductive pattern being the other one of the plurality of busbars and the plurality of fingers,
wherein, during the printing of the second conductive pattern, the first conductive pattern is substantially wet and the screen is disposed over the substrate in a manner such that the plurality of top portions are elevated above the first conductive pattern, and
wherein the first conductive pattern has a first shape, wherein the plurality of top portions form a pattern having a second shape encompassing the first shape.

2. The method of claim 1, wherein, during the printing of the second conductive pattern, the screen does not contact the first conductive pattern.

3. The method of claim 1, further comprising:
bringing at least some of the plurality of bottom portions into contact with the substrate at locations spaced apart from the first conductive pattern.

4. The method of claim 1, wherein the plurality of top portions are ceilings of a set of grooves formed in the screen.

5. The method of claim 1, further comprising:
pre-curing the first conductive pattern prior to printing the second conductive pattern.

6. The method of claim 1, further comprising:
jointly curing the first conductive pattern and the second conductive pattern.

7. The method of claim 1, wherein the screen is a second screen, the set of openings is a second set of openings and the printing material is a second printing material, wherein depositing the first conductive pattern comprises:
providing a first screen over the substrate, the first screen comprising a first set of openings; and
transferring a first printing material from the first screen to the substrate through the first set of openings to print the first conductive pattern on the substrate.

8. A screen for screen printing on a substrate used for the manufacture of a solar cell, comprising:
a body, comprising:
a set of openings for allowing printing material to pass there-through; and
a bottom side having a set of grooves shaped as a pattern including a plurality of lines, the set of grooves defining a varying vertical profile of the body having a plurality of bottom portions and a plurality of top portions such that the plurality of bottom portions are positioned lower than the plurality of top portions, wherein the plurality of top portions form a pattern having a second shape configured to encompass a first shape of a first conductive pattern deposited on the substrate, the first conductive pattern being one of a plurality of busbars and a plurality of fingers,
wherein the set of openings is configured for printing a second conductive pattern on the substrate, the second conductive pattern being the other one of the plurality of busbars and the plurality of fingers.

9. A processing line for processing a substrate used for the manufacture of a solar cell, comprising:
a first deposition station for depositing a first conductive pattern on a first side of the substrate, the first conductive pattern being one of a plurality of busbars and a plurality of fingers, the first conductive pattern having a first shape; and
a second deposition station downstream of the first deposition station, the second deposition station comprising a printer for printing a second conductive pattern on the first side of the substrate, the second conductive pattern being the other one of the plurality of busbars and the plurality of fingers, the printer including a screen including:
set of openings; and
a bottom side having a varying vertical profile including a plurality of bottom portions and a plurality of top portions such that the plurality of bottom portions are positioned lower than the plurality of top portions, wherein the plurality of top portions form a pattern having a second shape configured to encompass the first shape of the first conductive pattern.

10. The processing line of claim 9, further comprising:
a curing station downstream of the second deposition station for jointly curing the first conductive pattern and the second conductive pattern.

11. The processing line of claim 9, further comprising:
a pre-curing station downstream of the first deposition station and upstream of the second deposition station for pre-curing the first conductive pattern.

* * * * *

UNITED STATES PATENT AND TRADEMARK OFFICE
CERTIFICATE OF CORRECTION

PATENT NO. : 12,274,101 B2
APPLICATION NO. : 18/710346
DATED : April 8, 2025
INVENTOR(S) : Davide Colla Page 1 of 1

It is certified that error appears in the above-identified patent and that said Letters Patent is hereby corrected as shown below:

In the Claims

In Column 15, Line 27, in Claim 1, after "top" delete "high".

Signed and Sealed this
Twenty-third Day of September, 2025

John A. Squires
*Director of the United States Patent and Trademark Office*